United States Patent
Kim

[19]

[11] Patent Number: 5,821,574

[45] Date of Patent: Oct. 13, 1998

[54] CHARGE-COUPLED DEVICE HAVING DIFFERENT LIGHT-RECEIVING REGION AND CHARGE ISOLATION LAYER STRUCTURES

[75] Inventor: Yong Gwan Kim, Bundang-ku, Rep. of Korea

[73] Assignee: LG Semicon Co., Ltd., Chungcheongbuk-do, Rep. of Korea

[21] Appl. No.: 762,845

[22] Filed: Dec. 10, 1996

[30] Foreign Application Priority Data

Dec. 11, 1995 [KR] Rep. of Korea ................ 1995/48242

[51] Int. Cl.[6] .................. H01L 27/148; H01L 29/768
[52] U.S. Cl. ............................. 257/232; 257/233
[58] Field of Search ................... 257/232, 233

[56] References Cited

U.S. PATENT DOCUMENTS 5,514,887  5/1996  Hokari ........................... 257/222
5,619,049  4/1997  Kim .............................. 257/223

*Primary Examiner*—Ngân V. Ngô
*Attorney, Agent, or Firm*—Finnegan, Henderson, Farabow, Garrett & Dunner, L.L.P.

[57] ABSTRACT

A charge-coupled device includes a first P-type well formed in an N-type semiconductor substrate, a second P-type well formed repeatedly the first P-type well region, a charge-transfer region (BCCD) formed within the second P-type well region, an N-type photodiode region (PDN) formed in the upper portion of the first P-type well so as to be isolated from the charge-transfer region, a first high concentration P-type photodiode region (first PDP$^+$ region) formed in the upper surface of the N-type photodiode region excluding the charge-transfer region and serving as a charge-isolating layer, first and second poly-gates formed repeatedly on the charge-transfer region, and a second high concentration self aligned P-type photodiode region (second PDP$^+$ region) formed in the surface of the first high concentration P-type photodiode region. The charge-isolating region is thin to extend the potential pocket of each light-conversion PDN region.

4 Claims, 9 Drawing Sheets

CHARGE-COUPLED DEVICE HAVING DIFFERENT LIGHT-RECEIVING REGION AND CHARGE ISOLATION LAYER STRUCTURES

BACKGROUND OF THE INVENTION

The present invention relates to a charge-coupled device, and, more particularly, to a charge-coupled device and a method of manufacturing the same, in which the structure of a light-receiving region is changed to improve light sensitivity.

A conventional charge-coupled device will be described first, with reference to the attached drawings.

FIG. 1 is a layout diagram of the conventional charge-coupled device, in general. FIGS. 2A to 2G are cross-sectional views taken along the line II—II in FIG. 1 for illustrating a manufacturing method. FIG. 3 is a diagram showing the process sequence of the conventional charge-coupled device.

The conventional charge-coupled device is composed of a first P-type well 2 formed in a predetermined region of an N-type semiconductor substrate 1, a second P-type well 3 formed in a part excluding a light-receiving region within first P-type well 2, a PDN region 4 formed in a predetermined region within first P-type well 2, and a PDP$^+$ region 5 formed in the upper surface of PDN region 4. PDP$^+$ region 5 and PDN region 4 form photodiodes. BCCD region 6 is formed closer to one side of PDN region 4 and PDP$^+$region 5. A CST region 7 is formed for isolating BCCD region 6 and each photodiode region. Poly-gates I 8, and II 9 are formed to be insulated from each other on the upper side of BCCD region 6.

The manufacturing process of the aforementioned conventional charge-coupled device is as follows.

To begin with, as shown in FIGS. 2A and 2B, a P-type impurity ion-implantation is performed on a predetermined region of an N-type semiconductor substrate 1 to form a first P-type well 2 defining an active region.

Then, as shown in FIG. 2C, using a photoresist as a mask, another P-type impurity ion-implantation is performed in a part within first P-type well 2, thereby forming a second P-type well 3.

As shown in FIG. 2D, an ion-implantation is performed to form CST region 7. CST region 7 creates a potential barrier that isolates charges between the photodiode region and BCCD region 6.

As shown in FIG. 2E, a buried ion-implantation is performed on the CCD channel region to form BCCD region 6.

As shown in FIG. 2F, polysilicon is deposited on the entire surface of the resultant structure and patterned to form a poly-gate I 8 (not shown). After forming an interlayer insulating film (not shown) for insulating gates I and II from each other, polysilicon is deposited again and patterned to form a poly-gate II 9.

Then, using poly-gates I 8 and II 9 as masks, an N-type impurity ion is implanted in a light-receiving region, thereby forming PDN region 4.

Finally, as shown in FIG. 2G, an ion-implantation of a P-type impurity ion with high concentration is performed on the surface of PDN region 4, thereby forming a PDP$^+$ region 5.

FIG. 3 summarizes the process sequence of the conventional charge-coupled device. First, in step 60, the second P-type well 3 is formed. In step 62, the ion implantation is performed to form the CST region 7. Similarly, in step 64, an ion implantation is performed to form BCCD region 6. In steps 66 and 68, the poly-gate I 8 and poly-gate II 9 are formed, respectively. In step 70, the ion implantation is performed to form the PDN region 4. Finally, in step 72, another ion implantation is performed to form PDP$^+$ region 5.

In the conventional charge-coupled device as described above, BCCD region 6 is formed within second P-type well 3, so that the signal charge in BCCD region 6 moves without receiving the influence of SUB bias.

Further, as shown in FIG. 1, the CST layer surrounds most of the light-conversion region, but does not completely surround it. An opening in the CST region 7 is formed facing the nearest BCCD region. When a HIGH bias is applied to a gate serving as a transfer gate TG, the signal charge generated through light conversion is smoothly transferred to the BCCD region only through the opening part of CST region 7.

However, the conventional charge-coupled device in which the CST region formed as described above was not without its problems.

The width (W) of the CST layer, which is determined by the CST mask, exerts an important influence on the characteristics of the charge-coupled device. If the width of the CST layer is large, the potential area for each light emitting section becomes small due to side effect. Further, as the width of the CST increases, the opening in the CST layer becomes smaller, which deteriorates the charge-transfer efficiency (CTE) in the CCD channel.

Limitations in existing mask-patterning equipment, such as a stepper, make it difficult to form the width of the CST region 7 with adequate precision to prevent the aforementioned problems.

Accordingly, the sensitivity of the charge-coupled device is reduced.

SUMMARY OF THE INVENTION

In order to solve the aforementioned problems of the conventional charge-coupled device, it is an object of the present invention to provide a charge-coupled device and a method of manufacturing the same, in which the structures of the light-receiving region and charge-isolating layer are different from each other, thereby improving the sensitivity of the device.

To accomplish the object of the present invention, there is provided a charge-coupled device comprising a first P-type well formed in an N-type semiconductor substrate; a second P-type well formed above the first P-type well region; a charge-transfer region (BCCD) formed within the second P-type well region; an N-type photodiode region (PDN) formed in the upper portion of said first P-type well, said N-type photodiode region being isolated from said charge-transfer region; a first high concentration P-type photodiode region formed on the upper surface of the N-type photodiode region excluding said charge-transfer region, the first high concentration P-type photodiode region being used as a charge-isolating layer; first and second poly-gates formed on said charge-transfer region; and a second high concentration P-type photodiode region formed on the surface of the first high concentration P-type photodiode region, the second high concentration P-type photodiode region being self-aligned with the first and second poly-gates.

It is to be understood that both the foregoing general description and the following detailed description are exemplary and explanatory only and are not restrictive of the invention, as claimed.

BRIEF DESCRIPTION OF THE ATTACHED DRAWINGS

The accompanying drawings, which are incorporated in and constitute a part of this specification, illustrate an embodiment of the invention and together with the description, serve to explain the principles of the invention. In the drawings, FIG. 1 is a layout diagram of a conventional charge-coupled device;

DETAILED DESCRIPTION OF THE INVENTION

Hereinafter, a charge-coupled device of the present invention and a method of manufacturing the same will be described with reference to the attached drawings.

Figure 1:
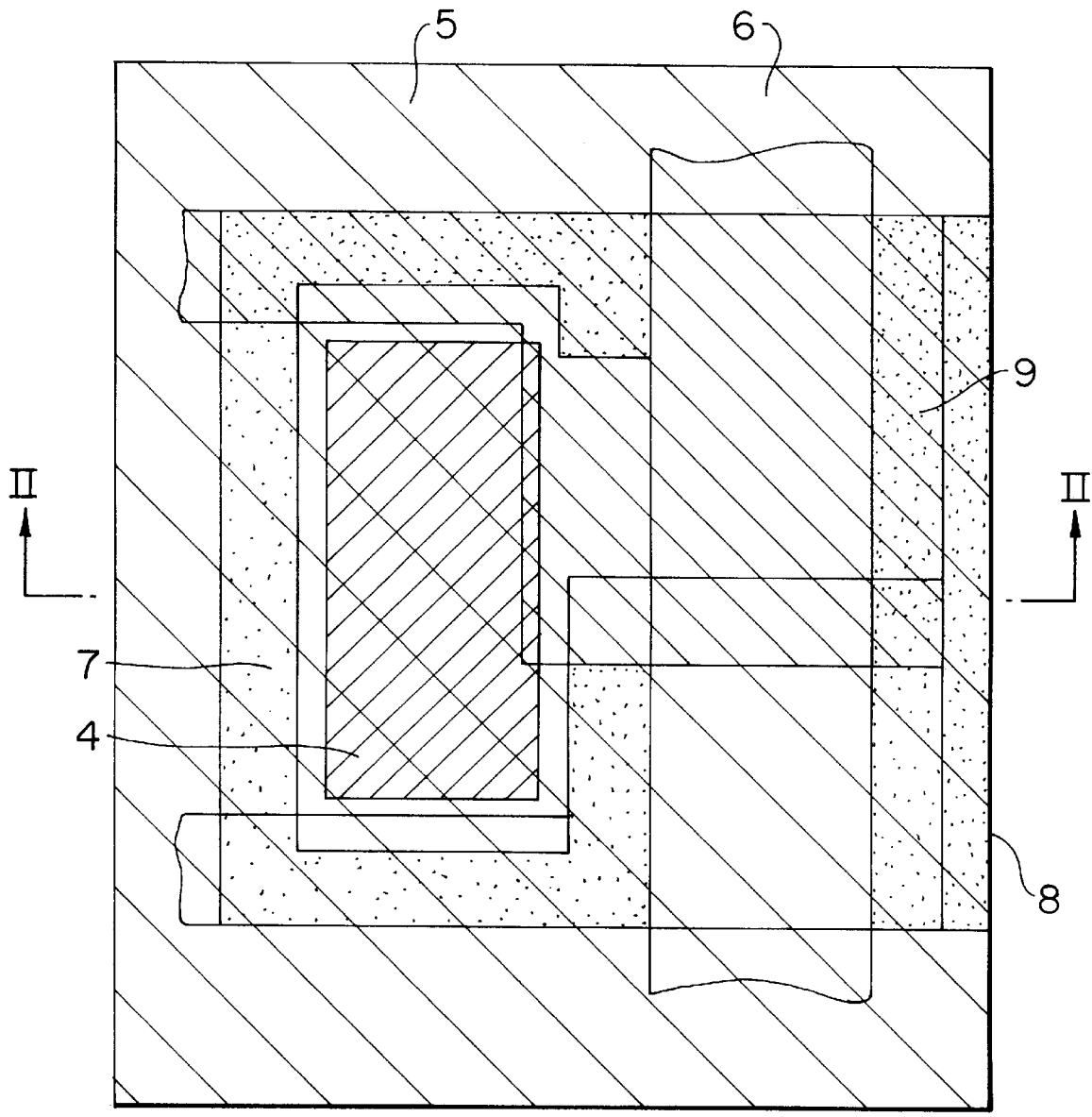
Figure 2A:
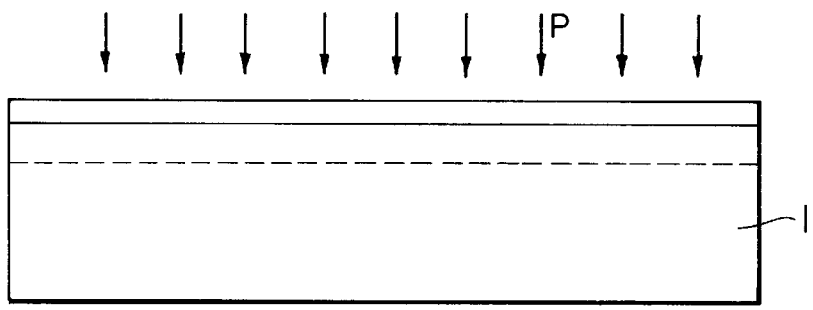
FIGS. 2A to 2G are cross-sectional views taken along line II—II in FIG. 1 for illustrating a manufacturing method of a conventional charge-coupled device.
Figure 2B:
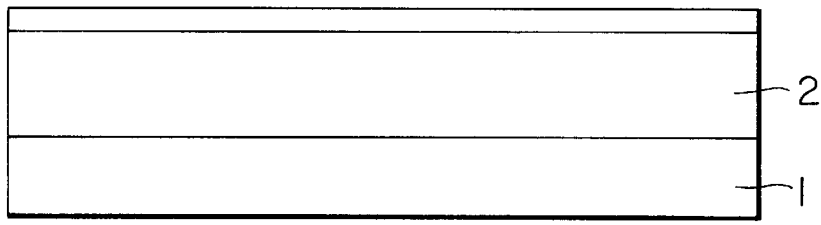
Figure 2C:
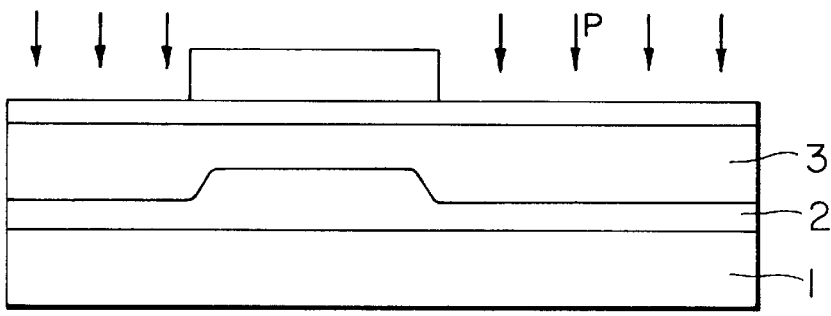
Figure 2D:
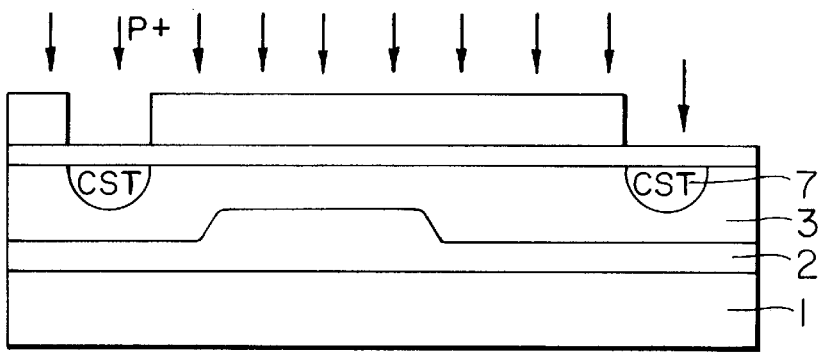
Figure 2E:
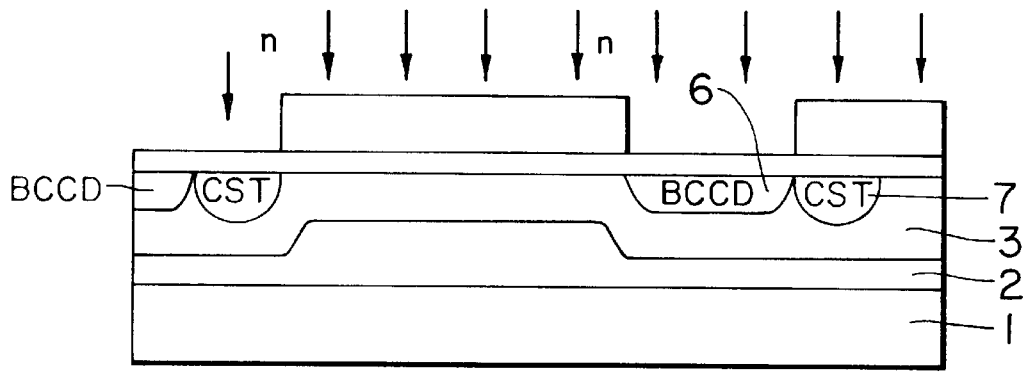
Figure 2F:
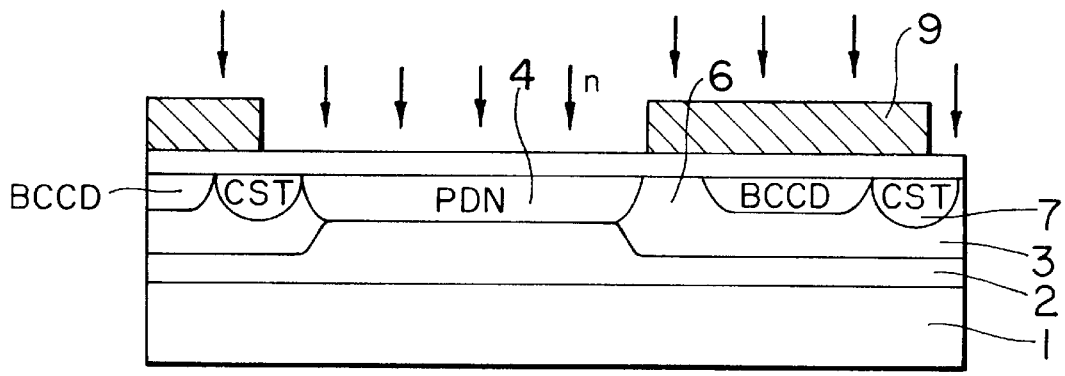
Figure 2G:
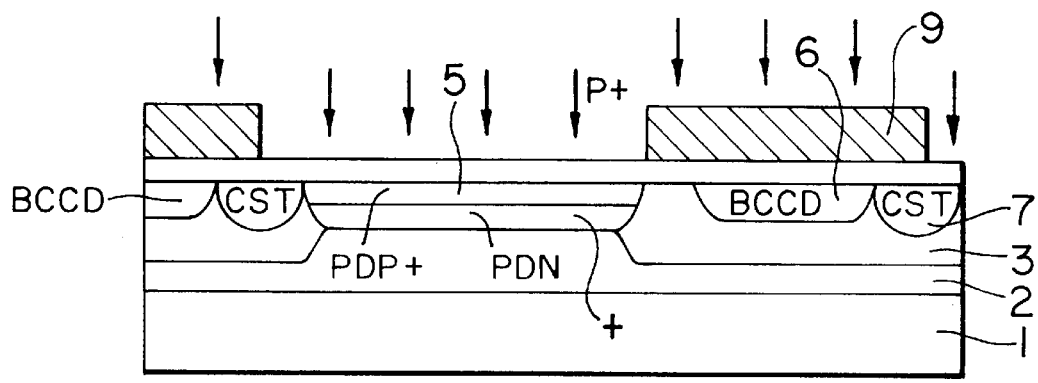
Figure 3:
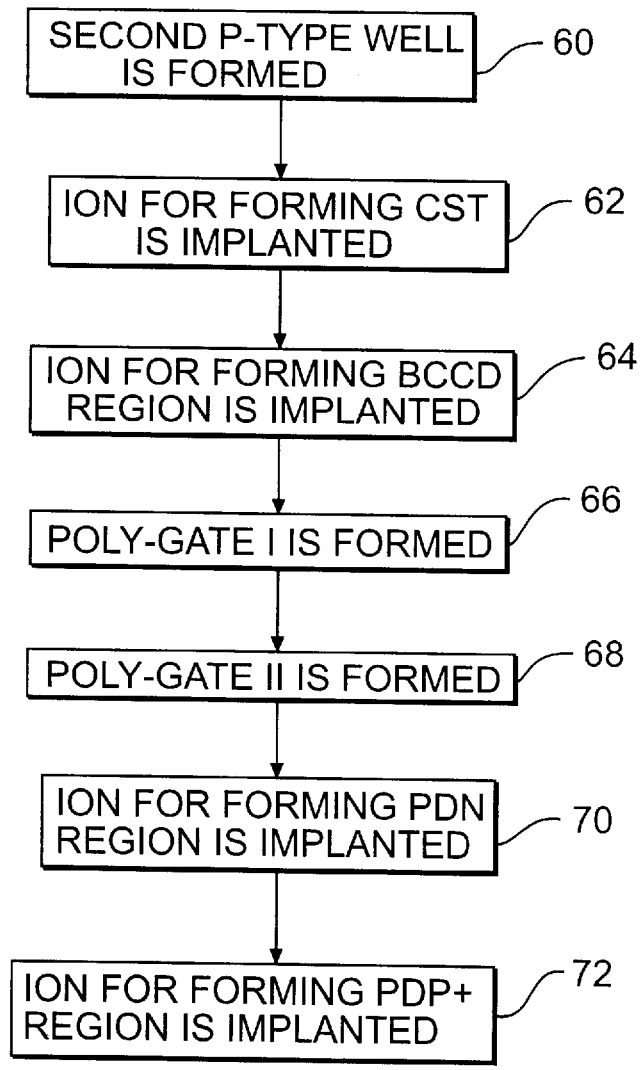
FIG. 3 is a diagram showing a process sequence of the conventional charge-coupled device.
Figure 4:
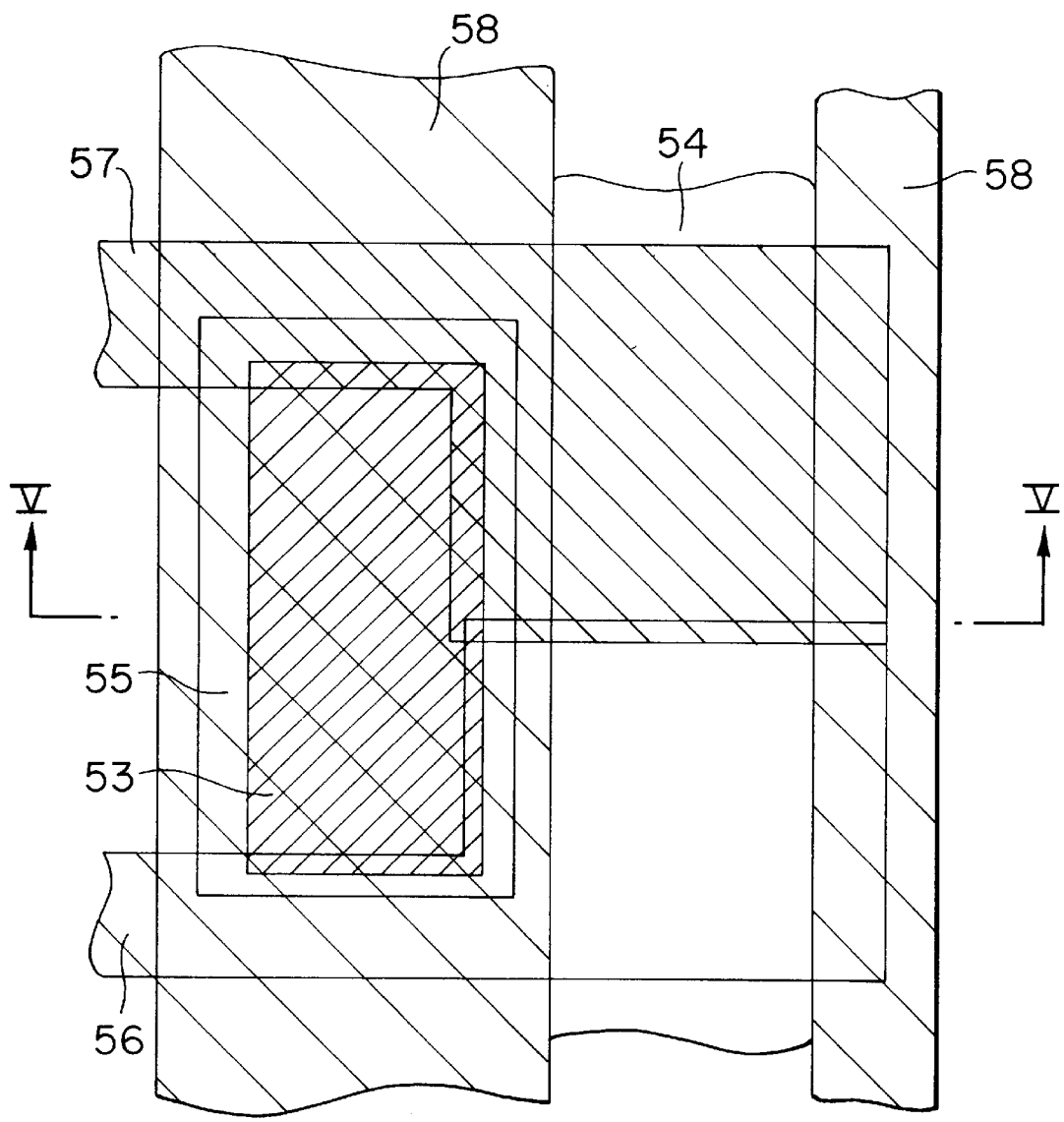
FIG. 4 is a layout diagram of a charge-coupled device according to the present invention.

FIG. 4 is a layout diagram of a charge-coupled device according to the present invention. FIGS. 5a to 5h are cross-sectional views, taken along line V—V' in FIG. 4, illustrating the manufacturing method of the present invention. FIG. 6 is a diagram showing the process sequence of a charge-coupled device according to the present invention.

In the charge-coupled device of the present invention, the movement of signal charge through the CCD channel and to the BCCD region 54 is not performed at the surface of a semiconductor substrate, but below an isolation region in the substrate. This is an area in the substrate where no CST layer exists.

To begin with, the charge-coupled device of the present invention is comprised of a first P-type well 51 formed in a predetermined region of an N-type semiconductor substrate 50, a plurality of second P-type wells 52 formed in a specific region of first P-type well 51, a photodiode light-converting PDN region 53 formed in first P-type well 51 region where second P-type well 52 is not formed, a first photodiode PDP$^+$ region 55 formed on PDN region 53 but extending to a width wider than that of PDN region 53, a second photodiode PDP$^+$ region 58 formed on PDP$^+$ region 55, a BCCD region 54 formed adjacent to the first and second PDP$^+$ regions 55 and 58 on second P-type well 52, and poly-gates I 56 and II 57 formed repeatedly on the upper side of BCCD region 54.

PDP$^+$ region 55 is formed below the lower region of poly-gate II 57, which serves as a transfer gate. PDP$^+$ region 55 is used as a charge-isolating layer. The signal charge generated from the PDN region 53 is transferred to the BCCD region 54, with first PDP$^+$ region 55 serving as a charge-isolating layer.

A method of manufacturing the above charge-coupled device of the present invention is as follows.

Figure 5A:
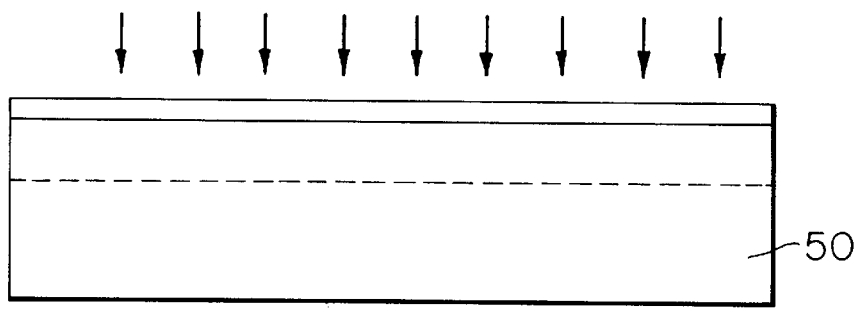
FIGS. 5A to 5H are cross-sectional views taken along line V—V in FIG. 4 for illustrating a manufacturing method of the present invention.
Figure 5B:
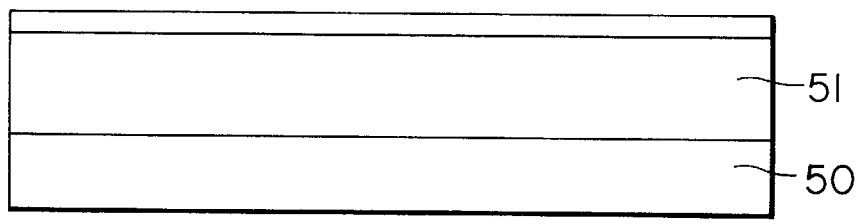
Figure 6:
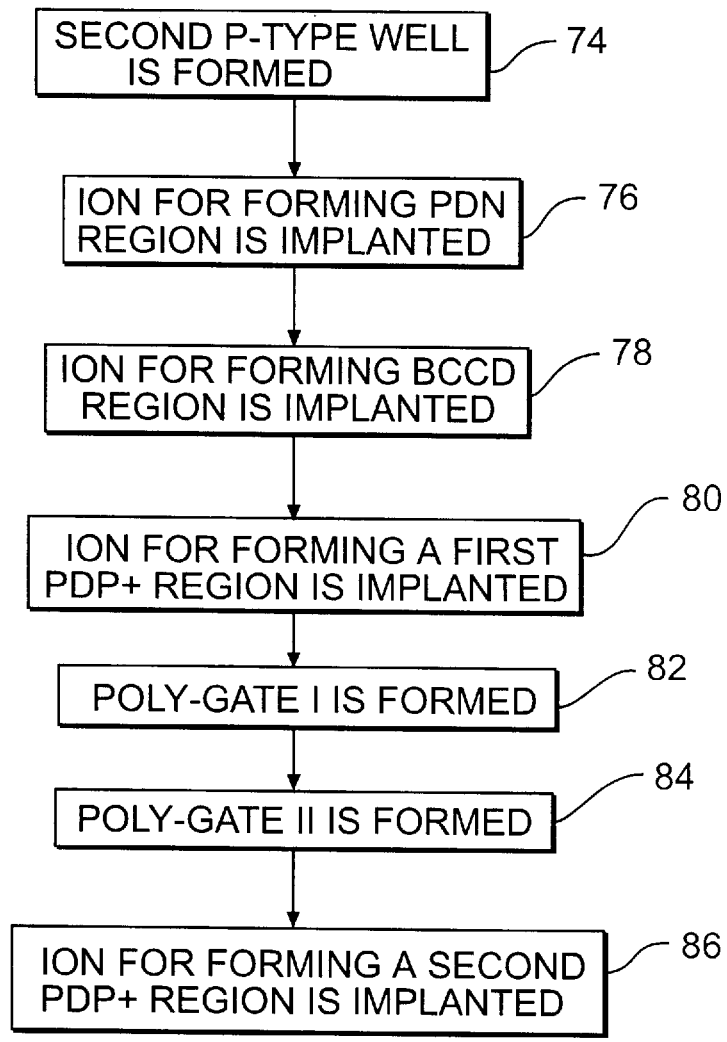
FIG. 6 is a diagram showing the process sequence of a charge-coupled device according to the present invention.
Figure 7:
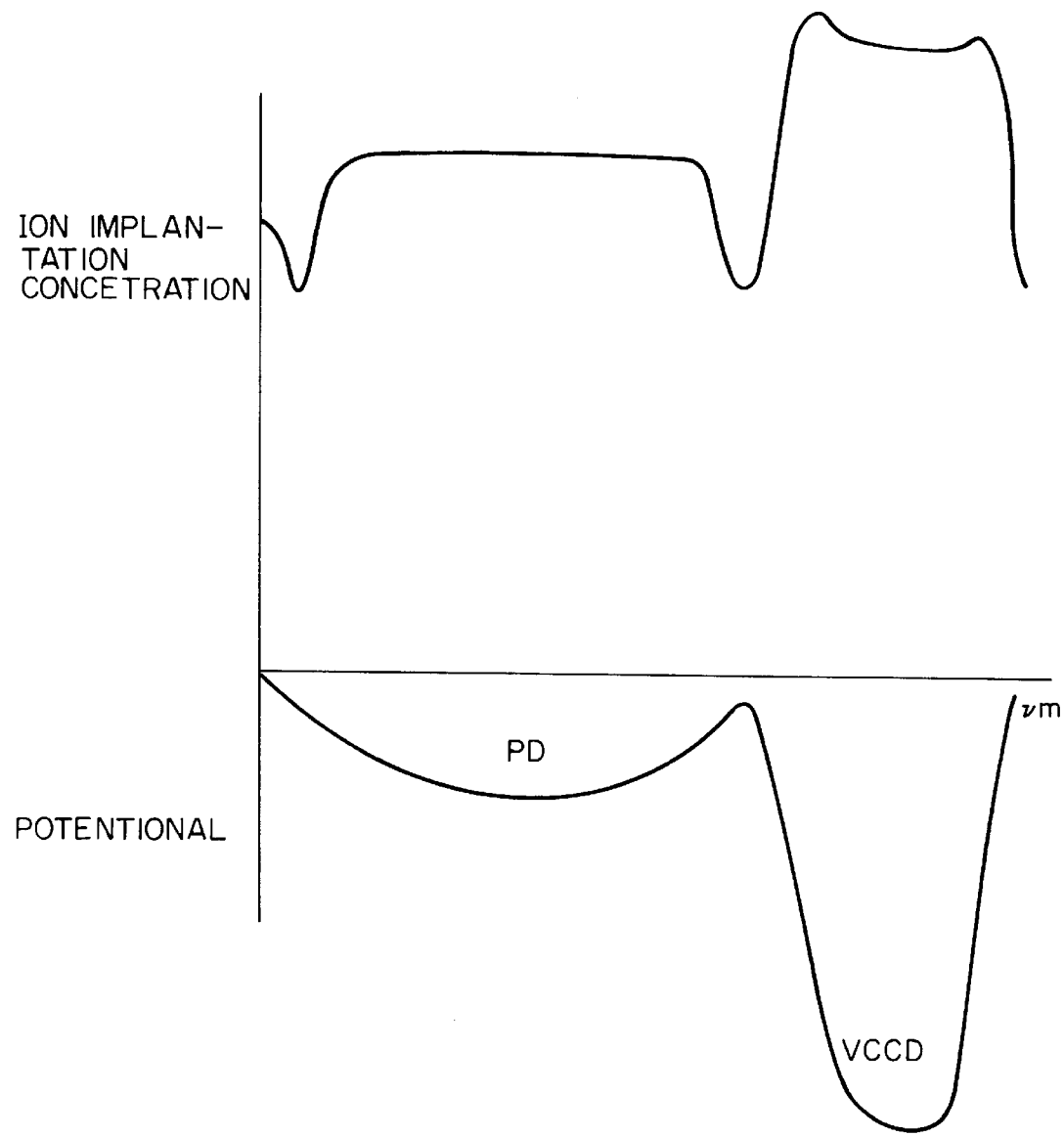
FIG. 7 is a potential profile taken along the line V—V in FIG. 4.

To begin with, as shown in FIG. 5A, a P-type impurity ion is implanted in an N-type semiconductor substrate 50, thereby forming a first P-type well 51, as shown in FIG. 5B.

Figure 5C:
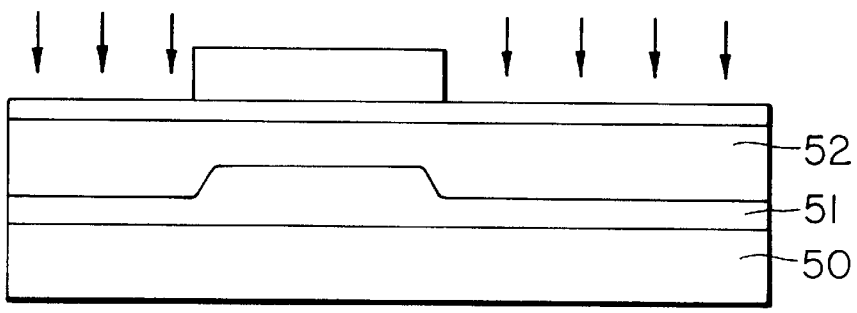

Then, as shown in FIG. 5C, using a photoresist as a mask, a P-type impurity is implanted in first P-type well region 51 thereby forming a second P-type well 52 for protecting a CCD channel region which will be formed in a subsequent process.

Figure 5D:
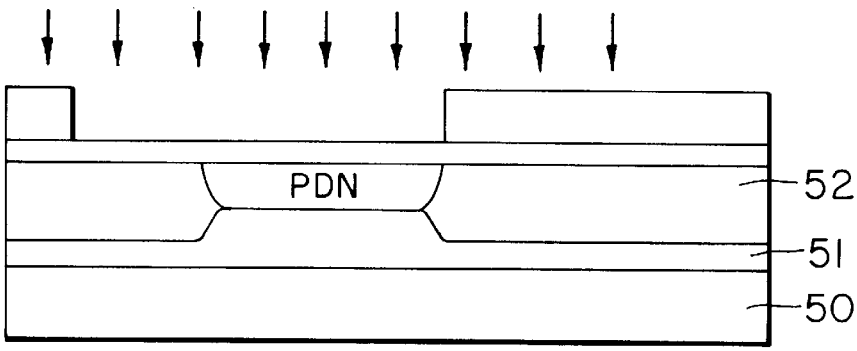

As shown in FIG. 5D, an N-type impurity ion is implanted on first P-type well region 51 so that no second P-type well 52 is formed, thereby forming a PDN region 53 serving as a light-conversion region. In order to form PDN region 53 so that it extends up to the lower region of a poly-gate I, PDN region 53 is formed before forming a poly-gate.

Figure 5E:
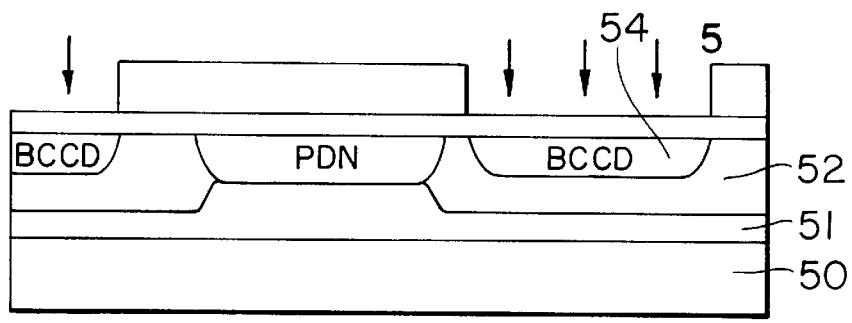

Then, as shown in FIG. 5E, a CCD channel region is formed for moving a signal charge generated from the light-conversion region including PDN region 53 to BCCD region 54 located at the right of FIG. 5E. The signal charge moves in one direction—to the right. The CCD channel region is formed by performing a buried ion implantation on second P-type well region 52, thereby forming BCCD region 54.

Figure 5F:
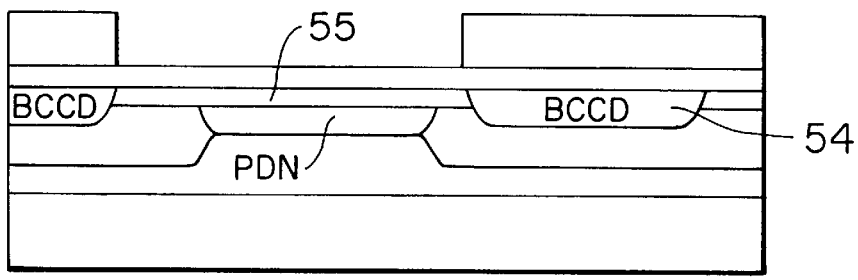

Then, as shown in FIG. 5F, a high concentration P-type impurity ion is implanted in the upper side of PDN region 53, thereby forming a first PDP$^+$ region 55. By controlling dose quantity, doping energy and the like, PDP$^+$ region 55 is formed as a wide region that serves as a charge isolation layer and extends to the lower region of a poly-gate II (which will be formed in a subsequent process).

Because the PDN region 53 extends to cover the region where, in the prior art, the CST layer is formed, charge-isolating between each light-conversion region and the CCD channel region is performed sufficiently. Further, this structure strengthens the barrier for the signal transferred from the light-conversion region to the CCD channel region, which induces bulk transfer of the signal charge.

Figure 5G:
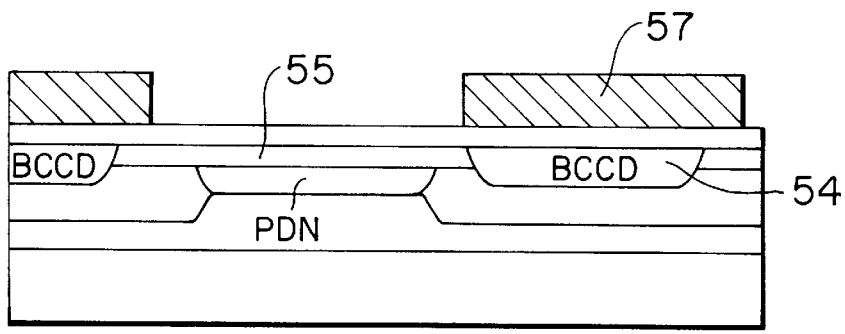

Then, as shown in FIG. 5G, a first polysilicon layer (not shown) is formed in a pattern, forming a poly-gate I 56. Thereafter, an insulating layer (not shown) for insulating the gates from each other is formed. Then, a second polysilicon layer is formed in a pattern, forming a poly-gate II 57.

Figure 5H:
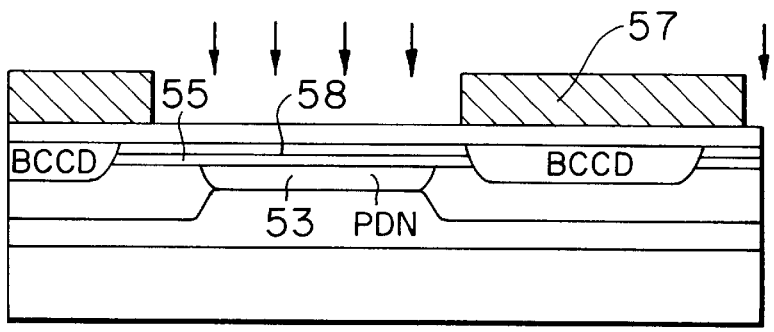

As shown in FIG. 5H, a high concentration P-type impurity ion is implanted by using poly-gates I 56 and II 57 as masks, thereby forming a second PDP$^+$ region 58 for reducing white defects.

FIG. 6 summarizes the process sequence for manufacturing a charge-coupled device of the present invention. First, in step 74, the second P-type well 52 is formed. In step 76, the ion implantation is performed to form the PDN region 53. Similarly, in step 78, an ion implantation is performed to form BCCD region 54. In step 80, an ion implantation is performed to form the first PDP$^+$ region 55. In steps 82 and 84, the poly-gate I 56 and poly-gate II 57 are formed, respectively. Finally, in step 86, another ion implantation is performed to form a second PDP$^+$ region.

In general, the PDP$^+$ layer formed on the surface of the PDN layer suppresses the generation of hole current. This prevents the flow of charge into the light-conversion region (PDN) through the surface state. Further, the interface of Si—SiO$_2$, which is a source of the hole current, is confined in a non-depletion region, thereby suppressing the generation of the hole current.

As described above, the charge-coupled device of the present invention in which the PDP$^+$ layer is used as the charge-isolating region without forming an additional CST layer, has the following additional effects.

First, since no CST mask is used, scale-down of the device is possible to a state in which the maximum mask precisions do not adversly effect the process.

Secondly, the charge-isolating region is a thin region, thereby extending the potential pocket of each light-conversion region. Further, the side effect of the CCD channel is reduced thereby to increase the charge-transfer efficiency (CTE). Thus, the sensitivity of the device is improved.

Thirdly, the surface of the device is covered upto the BCCD layer with the PDP$^+$ layer, thus isolating the edge parts of the PDN region and poly-gates I and II. This reduces white defects and flashing defects.

Fourthly, because the charge-isolating layer is formed in a box shape (in the conventional method, the channel stop layer is not formed on the part where the signal charge is transferred), the potential of the lower part of poly-gates I and II is formed uniformly. Thus, the vertical charge-transfer efficiency is improved.

Further, since no CST mask is used, the manufacturing cost and process time of the device are reduced due to the decrease in the number of masks required.

It will be apparent to those skilled in the art that various modifications and variations can be made in the present invention without departing from the scope or spirit of the invention.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

What is claimed is:

1. A charge-coupled device comprising:
    a first well of a first conductive type formed in a semiconductor substrate of a second conductive type;
    a photoelectric conversion region of the second conductive type formed in a surface of the first well;
    second wells of the first conductive type formed in the first well at both sides of the photoelectric conversion region;
    charge-transfer regions (BCCD) each formed in a surface of the second well, the charge-transfer regions being spaced from the photoelectric conversion region;
    first and second impurity regions of the first conductive type successively formed on the photoelectric conversion region;
    an insulating layer covering the charge-transfer regions and the first and second impurity regions; and
    first and second gates formed on the insulating layer over the photoelectric conversion region.

2. The charge-coupled device as claimed in claim 1, wherein the first and second impurity regions extend to the charge-transfer regions.

3. The charge-coupled device as claimed in claim 1, wherein the first impurity region is used as a charge-isolating layer.

4. The charge-coupled device as claimed in claim 1, wherein a concentration of the first impurity region is higher than that of the second wells.

* * * * *

UNITED STATES PATENT AND TRADEMARK OFFICE
CERTIFICATE OF CORRECTION

PATENT NO.: 5,821,574

DATED: October 13, 1998

INVENTOR: Yong Gwan KIM

It is certified that an error appears in the above-identified patent and that said Letters Patent is hereby corrected as shown below:

Title Page, Item [54], in the Title, line 3, "CHARGE ISOLATION" should read

--CHARGE-ISOLATING--.

Signed and Sealed this

Nineteenth Day of September, 2000

*Attest:*

Q. TODD DICKINSON

*Attesting Officer*     *Director of Patents and Trademarks*